US008933368B2

(12) United States Patent
Atsumi et al.

(10) Patent No.: US 8,933,368 B2
(45) Date of Patent: Jan. 13, 2015

(54) LASER PROCESSING METHOD FOR CUTTING PLANAR OBJECT

(75) Inventors: Kazuhiro Atsumi, Hamamatsu (JP); Koji Kuno, Hamamatsu (JP); Tatsuya Suzuki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 1132 days.

(21) Appl. No.: 12/443,755

(22) PCT Filed: Sep. 25, 2007

(86) PCT No.: PCT/JP2007/068515
§ 371 (c)(1),
(2), (4) Date: Mar. 31, 2009

(87) PCT Pub. No.: WO2008/041539
PCT Pub. Date: Apr. 10, 2008

(65) Prior Publication Data
US 2010/0012633 A1    Jan. 21, 2010

(30) Foreign Application Priority Data

Oct. 3, 2006 (JP) .............................. P2006-271986

(51) Int. Cl.
*B23K 26/00* (2014.01)
*H01L 21/78* (2006.01)
(Continued)

(52) U.S. Cl.
CPC ............ *H01L 21/78* (2013.01); *B23K 26/4075* (2013.01); *C03B 33/0222* (2013.01);
(Continued)

(58) Field of Classification Search
CPC .......... B23K 2201/40; B23K 26/0057; B23K 26/046; B23K 26/048; B23K 26/4075; H01L 21/02381; H01L 21/02675; H01L 21/78
USPC ............. 219/121.72, 121.31, 121.28, 121.39, 219/121.54, 121.6, 121.67, 121.75–121.83
See application file for complete search history.

(56) References Cited

U.S. PATENT DOCUMENTS 4,546,231 A     10/1985   Gresser et al.
5,268,887 A  *  12/1993   Honguh et al. ............ 369/44.13
(Continued)

FOREIGN PATENT DOCUMENTS

CN     1160228 A     9/1997
CN     1799752       7/2006
(Continued)

OTHER PUBLICATIONS

X. Liu et al., "Laser Ablation and Micromachining with Ultrashort Laser Pulses," IEEE Journal of Quantum Electronics, vol. 33, No. 10, Oct. 1997, pp. 1706-1716.
(Continued)

*Primary Examiner* — Dana Ross
*Assistant Examiner* — Ket D Dang
(74) *Attorney, Agent, or Firm* — Drinker Biddle & Reath LLP

(57) ABSTRACT

A modified region is accurately formed at a desirable position with respect to a laser light irradiation surface of an object to be processed. When an average difference γ has a value exceeding a predetermined threshold during trace recording, a particle segment Z including a line segment S where the average difference γ exceeds the predetermined threshold is defined. This determines that a particle exists on a line to cut 5 and randomly reflects measuring laser light, whereby a segment where the presence of the particle affects a control signal in a line segment to cut is detected as the particle segment Z. Correcting the control signal in the particle segment Z inhibits a converging lens from moving more than necessary because of an error included in the signal value under the influence of the presence of the particle, thus allowing the converging point of the processing laser light to accurately follow a front face 3.

10 Claims, 19 Drawing Sheets

(51) Int. Cl.
  *B23K 26/40* (2014.01)
  *C03B 33/02* (2006.01)
  *C03B 33/09* (2006.01)
  *B23K 26/04* (2014.01)
  *H01L 21/02* (2006.01)

(52) U.S. Cl.
  CPC ........... *C03B 33/091* (2013.01); *B23K 26/0057* (2013.01); *B23K 26/046* (2013.01); *B23K 26/048* (2013.01); *B23K 2201/40* (2013.01); *H01L 21/02381* (2013.01); *H01L 21/02675* (2013.01)
  USPC ............ 219/121.72; 219/121.31; 219/121.28; 219/121.29; 219/121.6; 219/121.75

(56) References Cited

U.S. PATENT DOCUMENTS

| | | | |
|---|---|---|---|
| 5,703,575 | A | 12/1997 | Kirkpatrick |
| 6,992,026 | B2 | 1/2006 | Fukuyo et al. |
| 7,396,742 | B2 | 7/2008 | Fukuyo et al. |
| 7,489,454 | B2 | 2/2009 | Fukuyo et al. |
| 7,547,613 | B2 | 6/2009 | Fukuyo et al. |
| 7,566,635 | B2 | 7/2009 | Fujii et al. |
| 7,592,237 | B2 | 9/2009 | Sakamoto et al. |
| 7,592,238 | B2 | 9/2009 | Fukuyo et al. |
| 7,605,344 | B2 | 10/2009 | Fukumitsu |
| 7,608,214 | B2 | 10/2009 | Kuno et al. |
| 7,615,721 | B2 | 11/2009 | Fukuyo et al. |
| 7,626,137 | B2 | 12/2009 | Fukuyo et al. |
| 7,709,767 | B2 | 5/2010 | Sakamoto |
| 7,718,510 | B2 | 5/2010 | Sakamoto et al. |
| 7,719,017 | B2 | 5/2010 | Tanaka |
| 7,732,730 | B2 | 6/2010 | Fukuyo et al. |
| 7,749,867 | B2 | 7/2010 | Fukuyo et al. |
| 7,754,583 | B2 | 7/2010 | Sakamoto |
| 7,825,350 | B2 | 11/2010 | Fukuyo et al. |
| 7,897,487 | B2 | 3/2011 | Sugiura et al. |
| 7,902,636 | B2 | 3/2011 | Sugiura et al. |
| 7,939,430 | B2 | 5/2011 | Sakamoto et al. |
| 7,947,574 | B2 | 5/2011 | Sakamoto et al. |
| 2005/0194364 | A1* | 9/2005 | Fukuyo et al. .......... 219/121.67 |
| 2005/0202596 | A1 | 9/2005 | Fukuyo et al. |
| 2005/0272223 | A1 | 12/2005 | Fujii et al. |
| 2006/0144828 | A1* | 7/2006 | Fukumitsu et al. ...... 219/121.67 |
| 2006/0148212 | A1 | 7/2006 | Fukuyo et al. |
| 2006/0255024 | A1 | 11/2006 | Fukuyo et al. |
| 2007/0085099 | A1 | 4/2007 | Fukumitsu et al. |
| 2007/0125757 | A1 | 6/2007 | Fukuyo et al. |
| 2007/0158314 | A1 | 7/2007 | Fukumitsu et al. |
| 2007/0252154 | A1 | 11/2007 | Uchiyama et al. |
| 2008/0035611 | A1 | 2/2008 | Kuno et al. |
| 2008/0037003 | A1 | 2/2008 | Atsumi et al. |
| 2008/0090382 | A1 | 4/2008 | Fujii et al. |
| 2008/0218735 | A1 | 9/2008 | Atsumi et al. |
| 2008/0251506 | A1 | 10/2008 | Atsumi et al. |
| 2009/0008373 | A1 | 1/2009 | Muramatsu et al. |
| 2009/0032509 | A1 | 2/2009 | Kuno et al. |
| 2009/0098713 | A1 | 4/2009 | Sakamoto |
| 2009/0107967 | A1 | 4/2009 | Sakamoto et al. |
| 2009/0117712 | A1 | 5/2009 | Sakamoto et al. |
| 2009/0166342 | A1 | 7/2009 | Kuno et al. |
| 2009/0166808 | A1 | 7/2009 | Sakamoto et al. |
| 2009/0250446 | A1 | 10/2009 | Sakamoto |
| 2009/0261083 | A1 | 10/2009 | Osajima et al. |
| 2009/0302428 | A1 | 12/2009 | Sakamoto et al. |
| 2010/0006548 | A1 | 1/2010 | Atsumi et al. |
| 2010/0009547 | A1 | 1/2010 | Sakamoto |
| 2010/0012632 | A1 | 1/2010 | Sakamoto |
| 2010/0015783 | A1 | 1/2010 | Fukuyo et al. |
| 2010/0025386 | A1 | 2/2010 | Kuno et al. |
| 2010/0032418 | A1 | 2/2010 | Kuno et al. |
| 2010/0055876 | A1 | 3/2010 | Fukuyo et al. |
| 2010/0151202 | A1 | 6/2010 | Fukumitsu |
| 2010/0176100 | A1 | 7/2010 | Fukuyo et al. |
| 2010/0184271 | A1 | 7/2010 | Sugiura et al. |
| 2010/0200550 | A1 | 8/2010 | Kumagai |
| 2010/0203678 | A1 | 8/2010 | Fukumitsu et al. |
| 2010/0203707 | A1 | 8/2010 | Fujii et al. |
| 2010/0227453 | A1 | 9/2010 | Sakamoto |
| 2010/0240159 | A1 | 9/2010 | Kumagai et al. |
| 2010/0258539 | A1 | 10/2010 | Sakamoto |
| 2010/0301521 | A1 | 12/2010 | Uchiyama |
| 2010/0311313 | A1 | 12/2010 | Uchiyama |
| 2010/0327416 | A1 | 12/2010 | Fukumitsu |
| 2011/0000897 | A1 | 1/2011 | Nakano et al. |
| 2011/0001220 | A1 | 1/2011 | Sugiura et al. |
| 2011/0021004 | A1 | 1/2011 | Fukuyo et al. |
| 2011/0027971 | A1 | 2/2011 | Fukuyo et al. |
| 2011/0027972 | A1 | 2/2011 | Fukuyo et al. |
| 2011/0037149 | A1 | 2/2011 | Fukuyo et al. |
| 2011/0274128 | A1 | 11/2011 | Fukumitsu et al. |

FOREIGN PATENT DOCUMENTS

| | | | |
|---|---|---|---|
| JP | 11-506837 | 6/1999 | |
| JP | 2003318074 A | 11/2003 | |
| JP | 2004-343008 | 12/2004 | |
| JP | 2006-187782 | 7/2006 | |
| TW | 20539980 | 12/2005 | |
| WO | WO 2004052586 A1 * | 6/2004 | ............. B23K 26/04 |

OTHER PUBLICATIONS

U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

* cited by examiner

LASER PROCESSING METHOD FOR CUTTING PLANAR OBJECT

TECHNICAL FIELD

The present invention relates to a laser processing method for cutting a planar object to be processed along a line to cut.

BACKGROUND ART

Known as a conventional laser processing method is one irradiating a planar object to be processed with processing laser light while locating a converging point within the object, so as to form a modified region to become a cutting start point within the object along a line to cut the object (see Patent Literature 1, for example).

For accurately forming a modified region at a desirable position with respect to a laser light irradiation surface of the object, there is a case where such a laser processing method irradiates the laser light irradiation surface along the line to cut with measuring laser light for measuring the displacement of the laser light irradiation surface and detects the light reflected by the laser light irradiation surface in response to this irradiation.

Patent Literature 1: Japanese Patent Application Laid-Open No. 2004-343008

DISCLOSURE OF INVENTION

Technical Problem

However, when particles such as dust and dirt exist on the line to cut, for example, the particles may randomly reflect the measuring laser light, so that the reflected light may not be detected accurately, whereby the modified region may not accurately be formed at the desirable position with respect to the laser light irradiation surface in the laser processing method mentioned above.

It is therefore an object of the present invention to provide a laser processing method which can accurately form a modified region at a desirable position with respect to a laser light irradiation surface of an object to be processed.

Solution to Problem

For achieving the above-mentioned object, the laser processing method in accordance with the present invention is a laser processing method of irradiating a planar object to be processed with processing laser light while locating a converging point within the object, so as to form a modified region to become a cutting start point within the object along a line to cut the object; the method comprising the steps of irradiating the object with measuring laser light along the line to cut, so as to detect a value corresponding to a reflected light component of the measuring laser light reflected by a laser light irradiation surface irradiated with the measuring laser light in the object, and moving a converging lens for converging the processing laser light to a predetermined position with respect to the laser light irradiation surface such that the detected value becomes a predetermined value, so as to acquire a signal for moving the converging lens; and, while locating the converging point of the processing converging lens at a predetermined position with respect to the laser light irradiation surface by moving the converging lens to a predetermined position with respect to the laser light irradiation surface according to the signal value, relatively moving the converging lens along the line to cut, so as to form the modified region within the object; wherein the step of acquiring the signal value defines, when the detected value has a value exceeding a predetermined threshold, defines a predetermined line segment including a line segment where the detected value exceeds the predetermined threshold, and corrects the signal value in the predetermined line segment.

While irradiating an object to be processed with measuring laser light along a line to cut, so as to detect a value corresponding to a reflected light component of the measuring laser light reflected by a laser light irradiation surface of the object; when the detected value has a value exceeding a predetermined threshold, the laser processing method in accordance with the present invention defines a predetermined line segment including a line segment where the detected value exceeds the predetermined threshold, and corrects the signal value in the predetermined line segment. This can determine that a particle exists on the line to cut and randomly reflects the measuring laser light, and detect a segment where the presence of the particle affects the detected value as a predetermined line segment. Correcting the signal value in the predetermined line segment can inhibit the converging lens from moving more than necessary because of an error included in the signal value under the influence of the presence of the particle, thus allowing the converging point of the processing laser light to accurately follow the laser light irradiation surface. Therefore, the present invention can accurately form a modified region at a predetermined position with respect to a laser light irradiation surface of an object to be processed. Here, the line segment refers to a segment where the detected value exceeds a predetermined threshold in a line segment to cut along a line to cut an object to be processed.

Preferably, the step of acquiring the signal value acquires a signal value other than that in the predetermined line segment again along the line to cut when the detected value has a value exceeding the predetermined threshold. Here, there is a case where a delay in the response of the signal value to the detected value makes it impossible for the signal value to be acquired accurately in the vicinity of a predetermined line segment where the presence of a particle affects the detected value. Acquiring the signal value other than that in the predetermined line segment again allows the converging point of the processing laser light to accurately follow the laser light irradiation surface in the vicinity of the predetermined line segment as well.

There are also cases where the signal value is corrected in the predetermined line segment by making the signal value constant in the predetermined line segment and where the signal value is corrected in the predetermined line segment by smoothing the signal value in the predetermined line segment with the signal value in the vicinity of the predetermined line segment. In these cases, the converging point of the processing laser light can smoothly follow the laser light irradiation surface.

There is also a case where the object has a semiconductor substrate, while the modified region includes a molten processed region.

Preferably, the method further comprises the step of cutting the object along the line to cut from the modified region acting as a cutting start point. This can accurately cut the object along the line to cut.

Advantageous Effects of Invention

The present invention can accurately form a modified region at a desirable position from a laser light irradiation surface of an object to be processed.

REFERENCE SIGNS LIST

1 . . . object to be processed; 3 . . . front face (laser light entrance surface); 5 . . . line to cut; L . . . laser light; P . . . converging point; S . . . line segment; V0 . . . feedback reference value (predetermined value); Z . . . particle segment (predetermined line segment)

DESCRIPTION OF EMBODIMENTS

In the following, a preferred embodiment of the present invention will be explained in detail with reference to the drawings. In the laser processing method in accordance with the embodiment, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
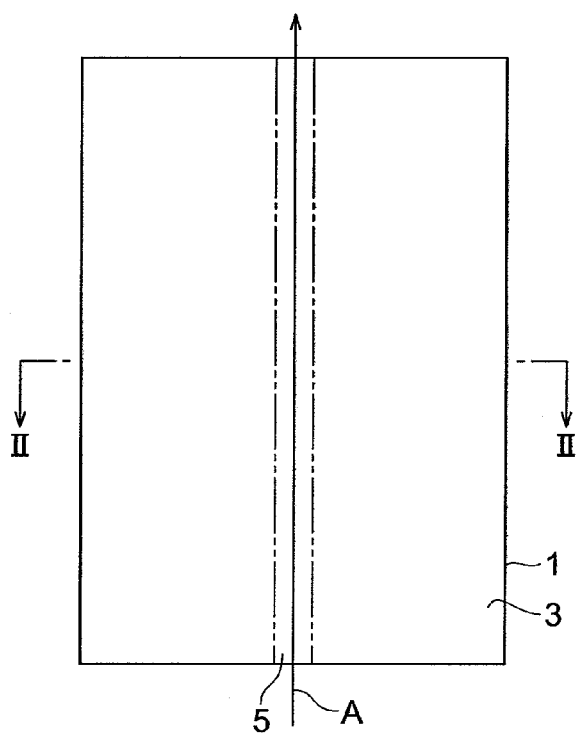
FIG. 1 is a plan view of an object to be processed during laser processing by a laser processing apparatus in accordance with an embodiment.
Figure 2:
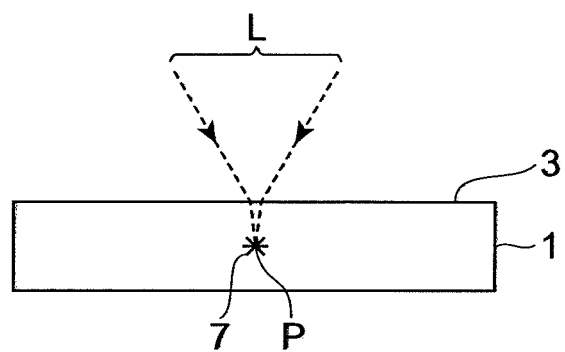
FIG. 2 is a sectional view of the object taken along the line II-II of FIG. 1.

The principle of the laser processing method in accordance with the embodiment using such multiphoton absorption will be explained with reference to FIGS. 1 to 6. As illustrated in FIG. 1, on a front face 3 of a wafer-like (planar) object to be processed 1, a line to cut 5 for cutting the object 1 exists. The line to cut 5 is a virtual line extending straight. As illustrated in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
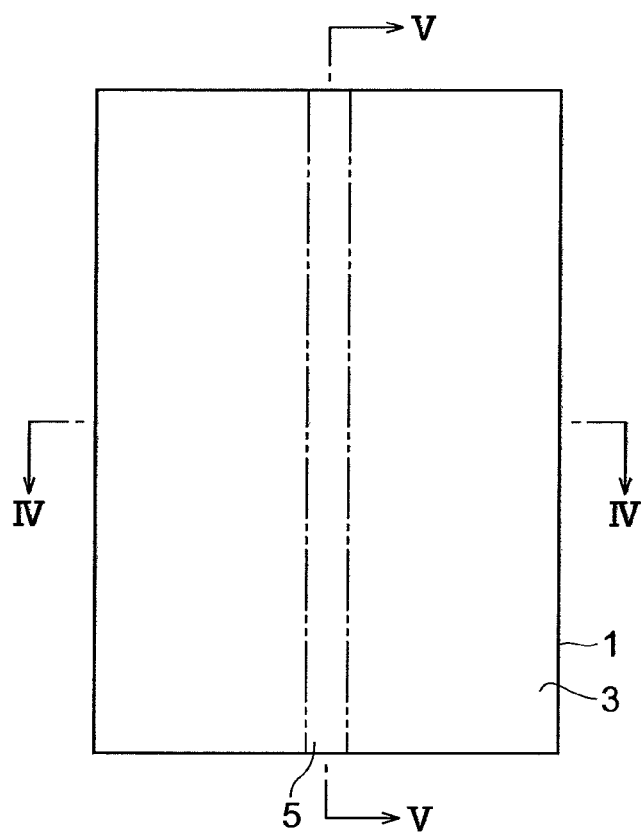
FIG. 3 is a plan view of the object after laser processing by the laser processing apparatus in accordance with the embodiment.
Figure 4:
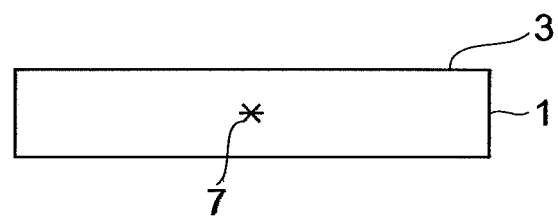
FIG. 4 is a sectional view of the object taken along the line IV-IV of FIG. 3.
Figure 5:
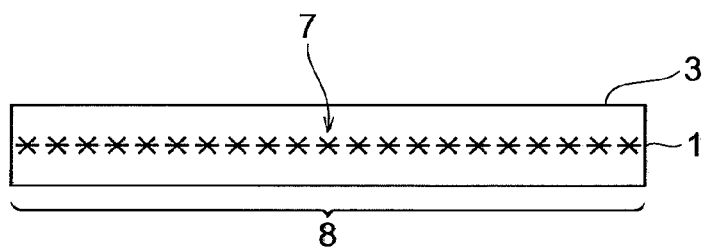
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as illustrated in FIGS. 3 to 5, the modified region 7 is formed along the line to cut 5 within the object 1, and becomes a cutting start region 8. The cutting start region 8 refers to a region which becomes a start point for cutting (fracturing) when the object 1 is cut. The cutting start region 8 may be made by forming the modified region 7 either continuously or intermittently.

In the laser processing method in accordance with this embodiment, the front face 3 of the object 1 hardly absorbs the laser light L and thus does not melt.

Figure 6:
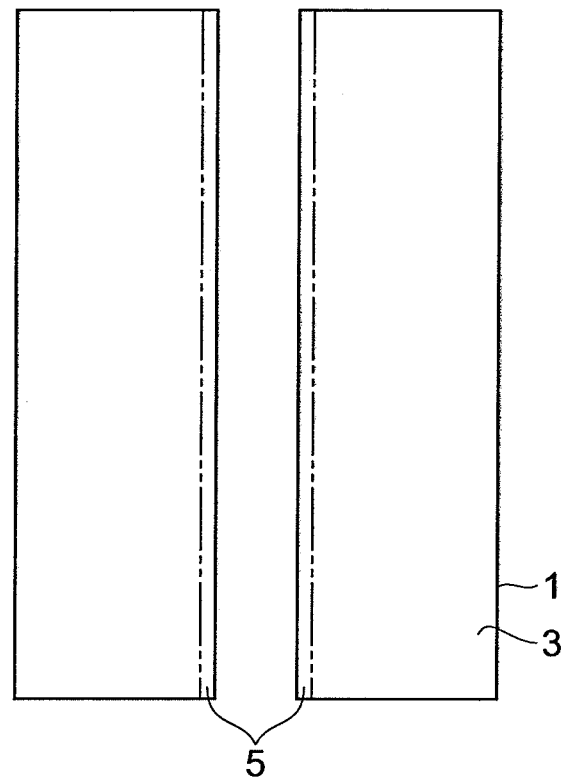
FIG. 6 is a plan view of the object cut by the laser processing apparatus in accordance with the embodiment.

Forming the cutting start region 8 within the object 1 makes it easier to generate fractures from the cutting start region 8 acting as a start point, whereby the object 1 can be cut with a relatively small force as illustrated in FIG. 6. Therefore, the object 1 can be cut with a high precision without generating unnecessary fractures on the front face 3 of the object 1.

There seem to be the following two ways of cutting the object 1 from the cutting start region 8 acting as a start point. One is where an artificial force is applied to the object 1 after the cutting start region 8 is formed, so that the object 1 fractures from the cutting start region 8 acting as a start point, whereby the object 1 is cut. This is the cutting in the case where the object 1 has a large thickness, for example. Applying an artificial force refers to exerting a bending stress or shear stress to the object 1 along the cutting start region 8, or generating a thermal stress by applying a temperature difference to the object 1, for example. The other is where the forming of the cutting start region 8 causes the object 1 to fracture naturally in its cross-sectional direction (thickness direction) from the cutting start region 8 acting as a start point, thereby cutting the object 1. This becomes possible if the cutting start region 8 is formed by one row of the modified region 7 when the object 1 has a small thickness, or if the cutting start region 8 is formed by a plurality of rows of the modified region 7 in the thickness direction when the object 1 has a large thickness. Even in this naturally fracturing case, fractures do not extend onto the front face 3 at a portion corresponding to an area not formed with the cutting start region 8 in the part to cut, so that only the portion corresponding to the area formed with the cutting start region 8 can be cleaved, whereby cleavage can be controlled well. Such a cleaving method with a favorable controllability is very effective, since the object 1 to be processed such as a silicon wafer has recently been apt to decrease its thickness.

The modified region formed by multiphoton absorption in the laser processing method in accordance with this embodiment encompasses the following cases (1) to (3):

(1) Case where the modified region is a crack region including one or a plurality of cracks An object to be processed (e.g., glass or a piezoelectric material made of $LiTaO_3$) is irradiated with laser light while locating a converging point therewithin under a condition with a field intensity of at least $1 \times 10^8$ (W/cm$^2$) at the converging point and a pulse width of 1 μs or less. This magnitude of pulse width is a condition under which a crack region can be formed only within the object while generating multiphoton absorption without causing unnecessary damages to the front face of the object. This generates a phenomenon of optical damage by multiphoton absorption within the object. This optical damage induces a thermal distortion within the object, thereby forming a crack region therewithin. The upper limit of field intensity is $1 \times 10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 μm)
(B) Laser
Light source: semiconductor laser pumping Nd:YAG laser
Wavelength: 1064 nm
Laser light spot cross-sectional area: $3.14 \times 10^{-8}$ cm$^2$
Oscillation mode: Q-switched pulse
Repetition frequency: 100 kHz
Pulse width: 30 ns
Output: output<1 mJ/pulse
Laser light quality: $TEM_{00}$
Polarizing property: linear polarization
(C) Converging lens
Transmittance at a laser light wavelength: 60%
(D) Moving rate of the mount table mounting the object: 100 mm/sec The laser light quality of $TEM_{00}$ means that the converging characteristic is so high that convergence to about the wavelength of laser light is possible.

Figure 7:
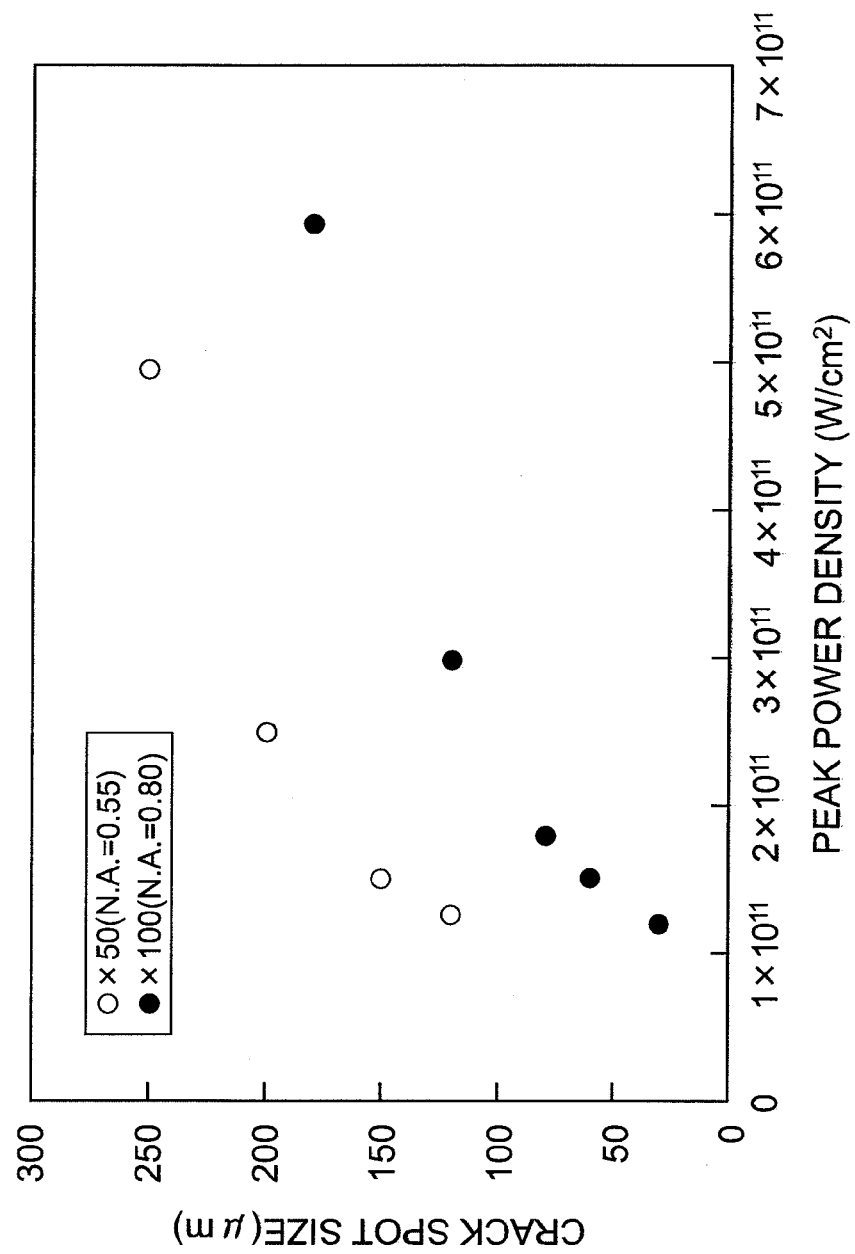
FIG. 7 is a graph illustrating relationships between the field intensity and crack spot size in the laser processing apparatus in accordance with the embodiment.

FIG. 7 is a graph illustrating the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the converging lens (C) has a magnification of ×100 and a numerical aperture (NA) of 0.80. On the other hand, data represented by whitened circles in the graph refer to a case where the converging lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
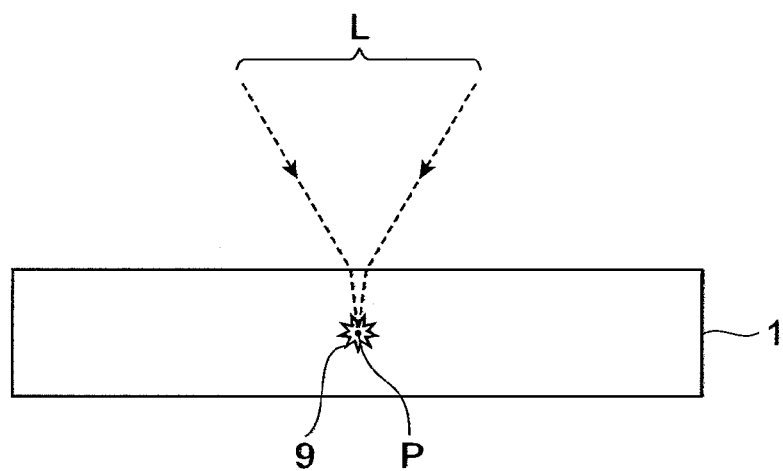
FIG. 8 is a sectional view of the object in a first step of the laser processing apparatus in accordance with the embodiment.
Figure 9:
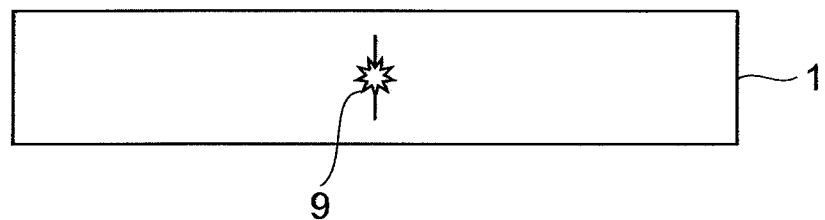
FIG. 9 is a sectional view of the object in a second step of the laser processing apparatus in accordance with the embodiment.
Figure 10:
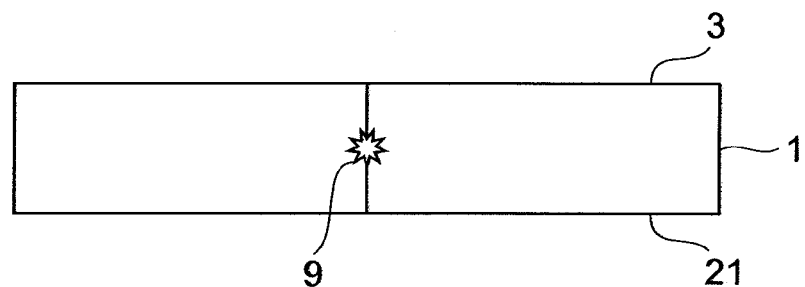
FIG. 10 is a sectional view of the object in a third step of the laser processing apparatus in accordance with the embodiment.
Figure 11:
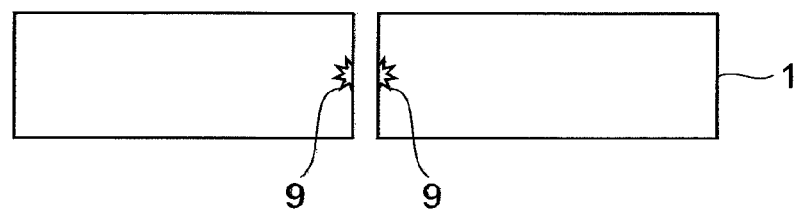
FIG. 11 is a sectional view of the object in a fourth step of the laser processing apparatus in accordance with the embodiment.

A mechanism by which the object to be processed is cut by forming a crack region will now be explained with reference to FIGS. 8 to 11. As illustrated in FIG. 8, the object 1 is irradiated with laser light L while the converging point P is located within the object 1 under a condition where multiphoton absorption occurs, so as to form a crack region 9 therewithin along a line to cut. The crack region 9 is a region containing one or a plurality of cracks. Thus formed crack region 9 becomes a cutting start region. A crack further grows from the crack region 9 acting as a start point (i.e., from the cutting start region acting as a start point) as illustrated in FIG. 9, and reaches the front face 3 and rear face 21 of the object 1 as illustrated in FIG. 10, whereby the object 1 fractures and is consequently cut as illustrated in FIG. 11. The crack reaching the front face 3 and rear face 21 of the object 1 may grow naturally or as a force is applied to the object 1.

(2) Case where the modified region is a molten processed region

An object to be processed (e.g., semiconductor material such as silicon) is irradiated with laser light while locating a converging point within the object under a condition with a field intensity of at least $1 \times 10^8$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ (W/cm$^2$), for example. The pulse width is preferably 1 ns to 200 ns, for example.

By an experiment, the inventors verified that a molten processed region was formed within a silicon wafer (semiconductor substrate). The following are conditions of the experiment.

Figure 12:
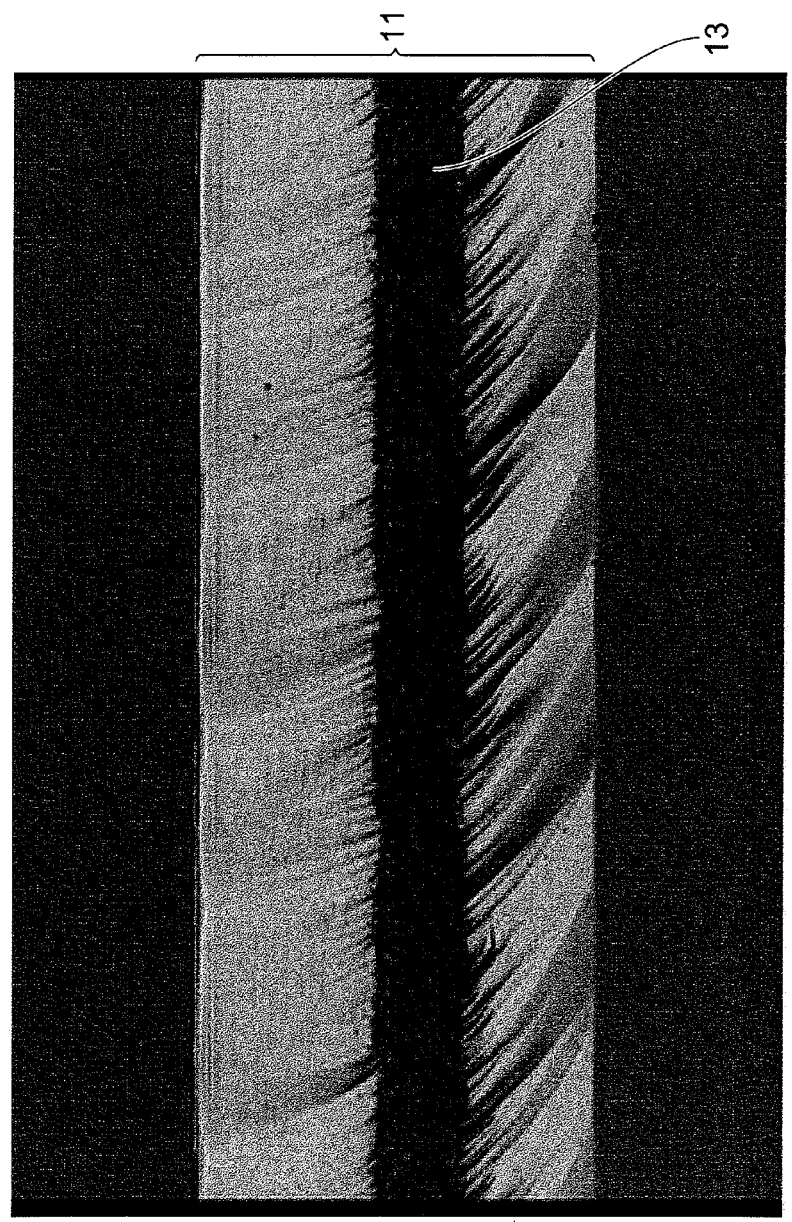
FIG. 12 is a view illustrating a photograph of a cut section in a part of a silicon wafer cut by the laser processing apparatus in accordance with the embodiment.

(A) Object to be processed: silicon wafer (with a thickness of 350 μm and an outer diameter of 4 inches)
(B) Laser
Light source: semiconductor laser pumping Nd:YAG laser
Wavelength: 1064 nm
Laser light spot cross-sectional area: $3.14 \times 10^{-8}$ cm$^2$
Oscillation mode: Q-switched pulse
Repetition frequency: 100 kHz
Pulse width: 30 ns Output: 20 μJ/pulse
Laser light quality: TEM$_{00}$
Polarizing property: linear polarization
(C) Converging lens
Magnification: ×50
N.A.: 0.55
Transmittance at a laser light wavelength: 60%
(D) Moving rate of the mount table mounting the object: 100 mm/sec FIG. 12 is a view illustrating a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
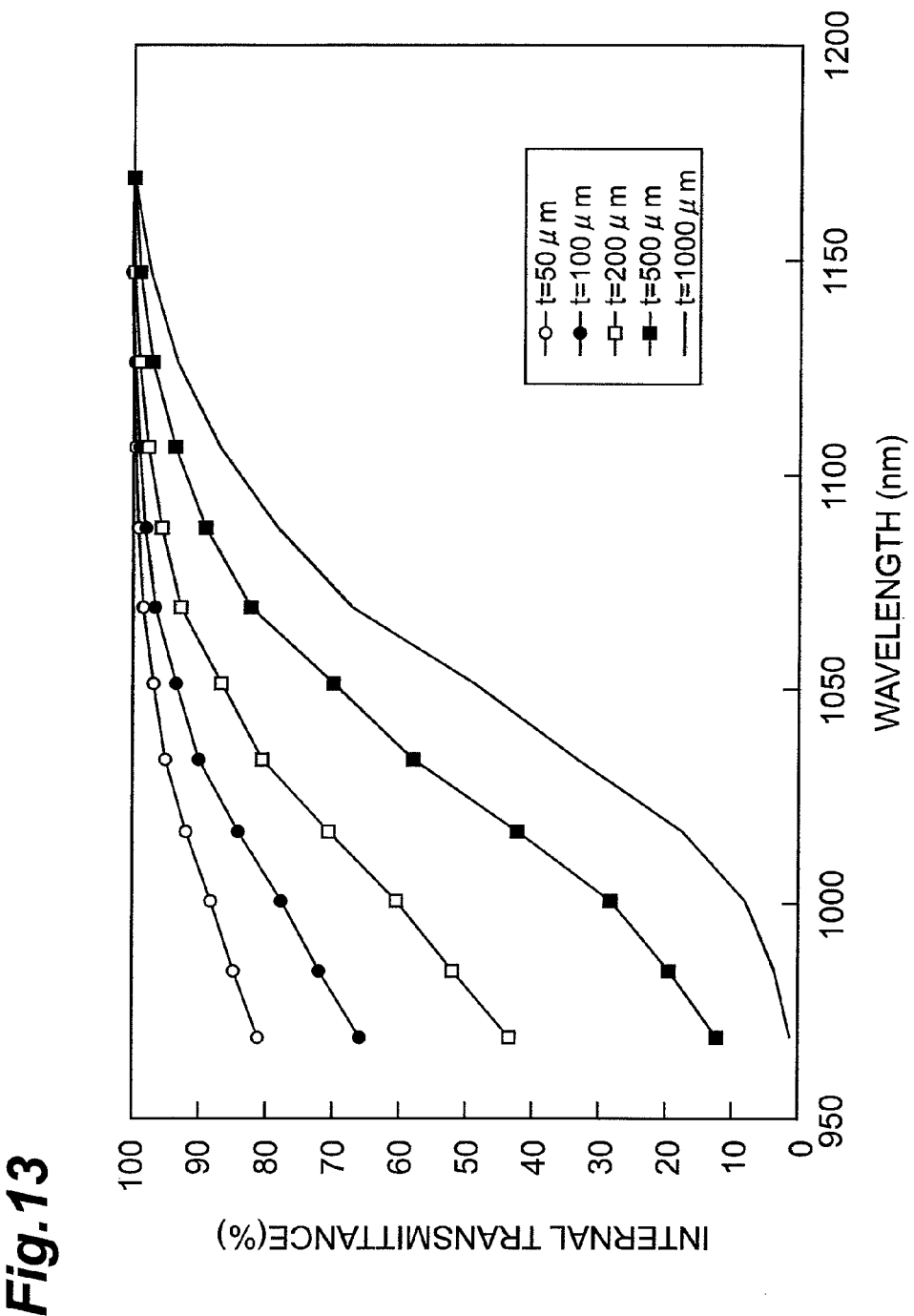
FIG. 13 is a graph illustrating relationships between the laser light wavelength and the transmittance within a silicon substrate in the laser processing apparatus in accordance with the embodiment.

The fact that the molten processed region 13 is formed by multiphoton absorption will now be explained. FIG. 13 is a graph illustrating relationships between the laser light wavelength and the transmittance within the silicon substrate. Here, the respective reflected components on the front and rear sides of the silicon substrate are eliminated, so as to represent the internal transmittance alone. The respective relationships are illustrated in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 illustrated in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by the absorption of laser light within the silicon wafer 11 (i.e., not by usual heating with the laser light) but by multiphoton absorption. The forming of a molten processed region by multiphoton absorption is disclosed, for example, in "Ultrashort Pulse Laser Microprocessing of Silicon", Preprints of the National Meetings of Japan Welding Society, Vol. 66 (April, 2000), pp. 72-73.

A fracture is generated in a silicon wafer from a cutting start region formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the cutting start region to the front and rear faces of the silicon wafer encompasses a case where the fracture grows from a state in which the molten processed region forming the cutting start region is molten and a case where the fracture grows when the molten processed region forming the cutting start region is re-solidified from the molten state. In either case, the molten processed region is formed only within the silicon wafer, and thus is present only within the cut section after cutting as illustrated in FIG. 12. When a cutting start region is thus formed within the object by a molten processed region, unnecessary fractures deviating from a cutting start region line are harder to occur at the time of cleaving, whereby cleavage control becomes easier. Here, the molten processed region may be formed not only by multiphoton absorption but also by other absorption actions.

(3) Case where the modified region is a refractive index change region

An object to be processed (e.g., glass) is irradiated with laser light while locating a converging point within the object under a condition with a field intensity of at least $1 \times 10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

Though the cases (1) to (3) are explained in the foregoing as a modified region formed by multiphoton absorption, a cutting start region may be formed as follows while taking account of the crystal structure of a wafer-like object to be processed, its cleavage characteristic, and the like, whereby the object can be cut with a favorable precision by a smaller force from the cutting start region acting as a start point.

That is, in the case of a substrate made of a monocrystal semiconductor having a diamond structure such as silicon, it will be preferred if a cutting start region is formed in a direction extending along a (111) plane (first cleavage plane) or a (110) plane (second cleavage plane). In the case of a substrate made of a group III-V compound semiconductor of sphalerite structure such as GaAs, it will be preferred if a cutting start region is formed in a direction extending along a (110) plane. In the case of a substrate having a crystal structure of hexagonal system such as sapphire (Al$_2$O$_3$), it will be preferred if a cutting start region is formed in a direction extending along a (1120) plane (A plane) or a (1100) plane (M plane) while using a (0001) plane (C plane) as a principal plane.

When the substrate is formed with an orientation flat in a direction to be formed with the above-mentioned cutting start region (e.g., a direction extending along a (111) plane in a monocrystal silicon substrate) or a direction orthogonal to the former direction, the cutting start region extending in the direction to be formed with the cutting start region can be formed easily and accurately with reference to the orientation flat.

The preferred embodiment of the present invention will now be explained.

Figure 14:
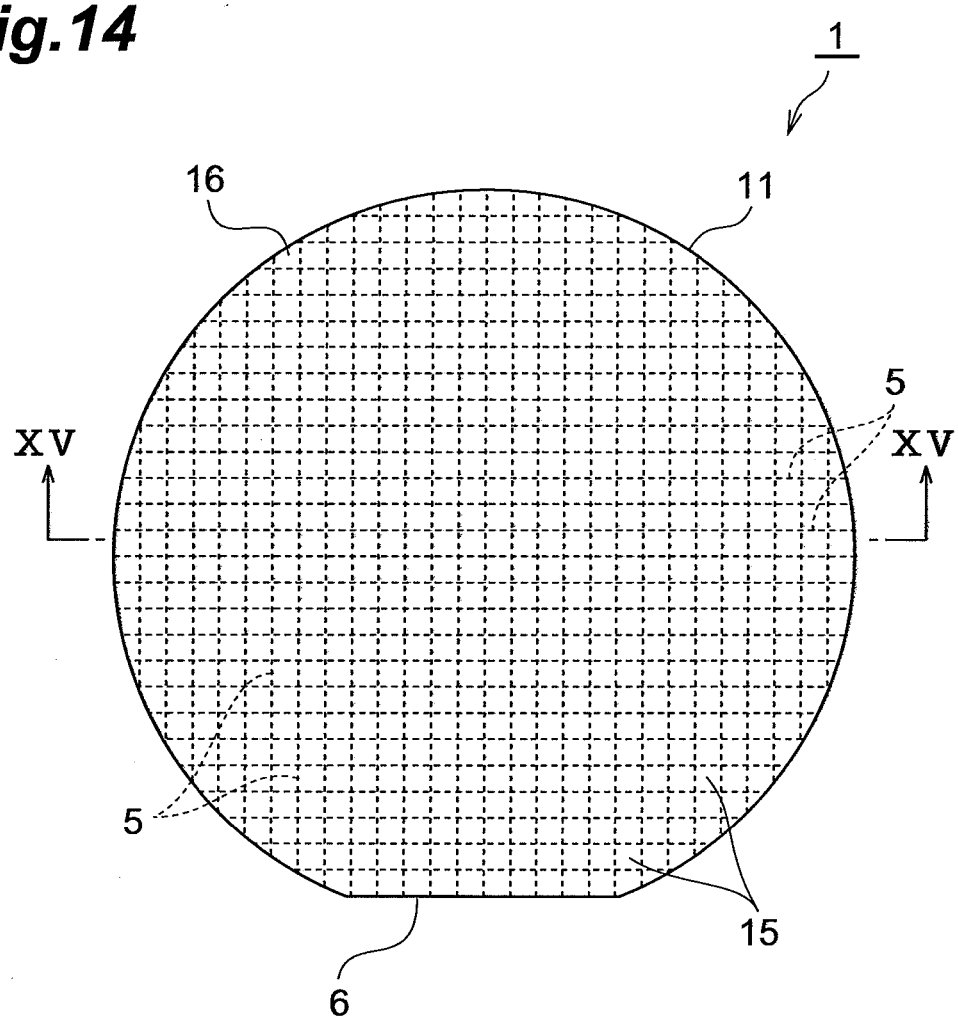
FIG. 14 is a front view illustrating an object to be processed.
Figure 15:
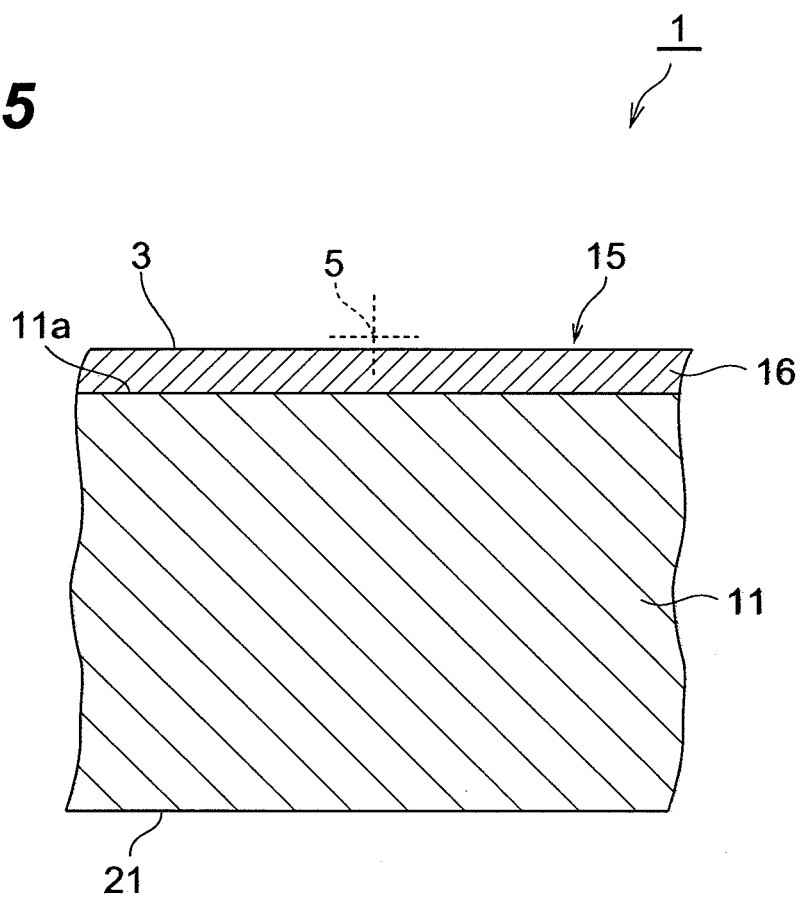
FIG. 15 is a partial sectional view taken along the line XV-XV of FIG. 14.

As illustrated in FIGS. 14 and 15, an object to be processed 1 comprises a silicon wafer 11 and a functional device layer 16 which is formed on a front face 11a of the silicon wafer 11 while including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11. Such an object to be processed 1 is cut along lines to cut 5 which are set like grids passing between the functional devices adjacent to each other, so as to become chips each having a size of 1 mm×1 mm, for example.

An example of cutting the object 1 will now be explained. First, an expandable tape is attached to the rear face 21 of the object 1, which is then mounted on a mount table. Subsequently, the object 1 is irradiated with processing laser light from the front face 3 while locating a converging point within the silicon wafer 11 with a converging lens under a condition generating multiphoton absorption, so as to form a modified region to become a cutting start point within the object 1 along each line to cut 5. Then, the expandable tape is expanded, so that the object 1 is accurately cut into the functional devices 15 along the line to cut 5 from the modified region acting as the cutting start point, whereby a plurality of semiconductor chips are separated from each other. The modified region may include not only the molten processed region but also crack regions and the like.

The forming of the modified region mentioned above will now be explained in more detail. The following explanation will assume that the thickness direction of the object 1 is the Z direction.

First, on the line to cut 5, the front face 3 of the object 1 is captured through the converging lens by a CCD camera, for example, and the mount table is relatively moved in the Z direction such as to maximize the contrast of a projected reticle pattern. The Z-directional position of the front face 3 at this time is defined as an in-focus position (where the displacement of the front face 3 is 0 µm).

Subsequently, measuring laser light is emitted through the converging lens to the object 1, and its reflected light component reflected by the front face 3 is received by a quadrant photodiode, for example. The reflected light component is provided with astigmatism by a shaping optical system constituted by a cylindrical lens and a planoconvex lens, for example, and then is converged onto a light-receiving surface of the quadrant photodiode, so as to form a converged light image on the light-receiving surface. Therefore, the converged light image has such a form as to change in response to the displacement of the front face 3 of the object 1 (the position of the converging point of the measuring laser light with respect to the front face 3). Hence, receiving the reflected light component with the quadrant photodiode can detect not only the displacement of the front face 3 as an astigmatism signal but also a total light quantity signal corresponding to the total light quantity of the reflected light component.

Next, a displacement sensor signal is determined from the astigmatism signal and total light quantity signal by a controller, for example, and is stored as a feedback reference value (predetermined value) V0. That is, the displacement sensor signal at the in-focus position is stored as a feedback target signal V0. The displacement signal, which is one obtained by dividing the astigmatism signal by the total light quantity signal, is a relative value of the astigmatism signal with respect to the received total light quantity. This can stably detect the displacement of the front face 3 even when the light quantity varies.

Subsequently, while the mount table is relatively moved along the line to cut 5 at a speed of 300 mm/s, for example, the displacement sensor signal is calculated, and the Z-directional position of the converging lens is controlled by a piezoelectric device, for example, such that the displacement sensor signal keeps the feedback reference value V0, i.e., the distance between the front face 3 and the converging lens becomes that at the in-focus position. Also, a control signal (signal value) for this control is recorded (i.e., trace recording is performed) in the controller, for example. Here, the position control is feedback control with a sampling period of 0.05 ms. A segment of the object 1 along the line to cut 5 is referred to as a line segment to cut.

Figure 19:
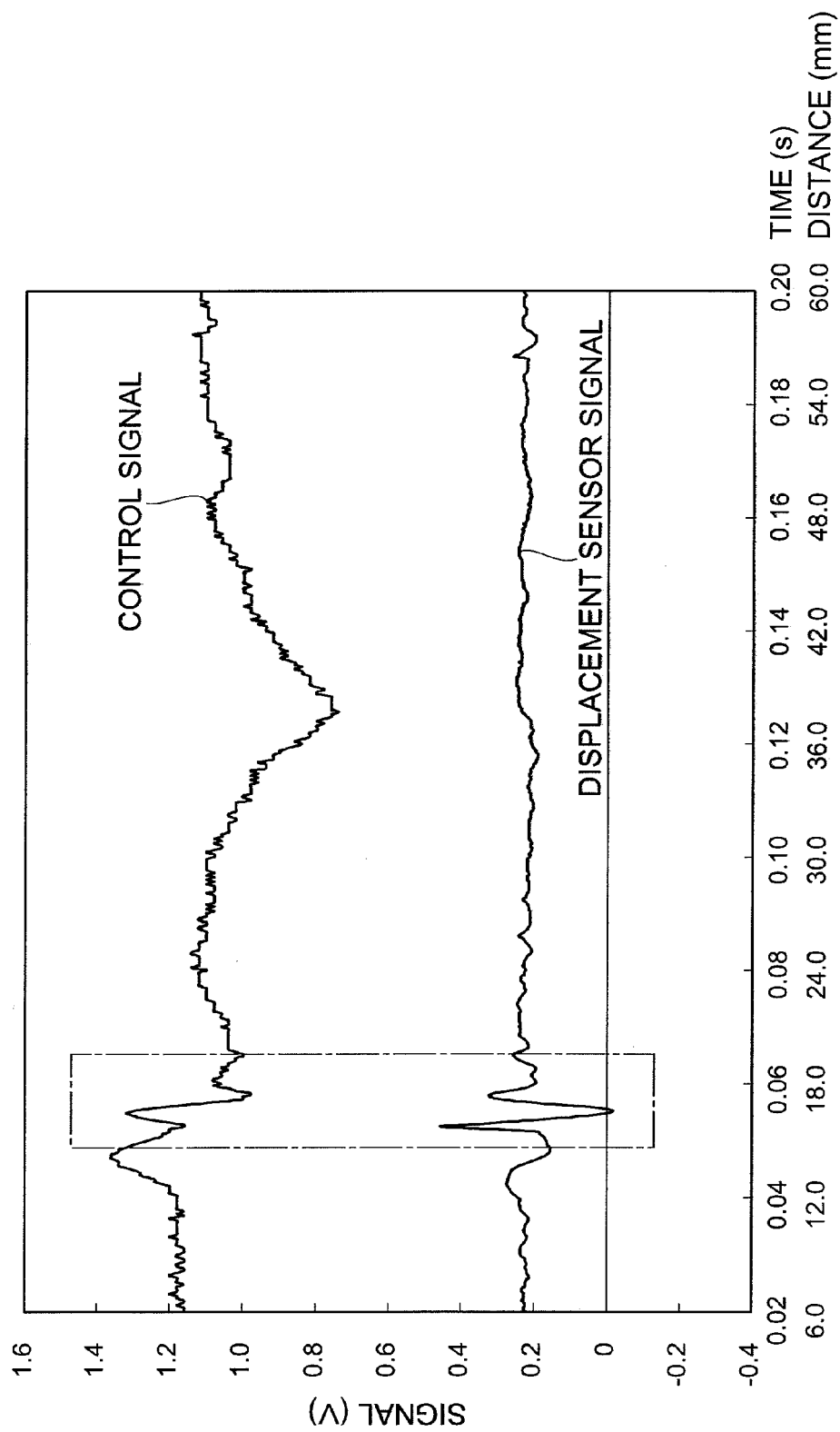
FIG. 19 is a chart for explaining a control signal in the particle segment in a conventional laser processing method.

There is a case where a particle such as dust, dirt, or trash exists on the line to cut 5 in the front face 3 of the object 1. In this case, the measuring laser light is randomly reflected in a segment where the particle exists in a line segment to cut in a conventional laser processing method. Therefore, as illustrated in FIG. 19, a displacement sensor signal fluctuates greatly, which drives the piezoelectric device more than necessary, thereby disturbing a control signal as well (see the inside of the frame in the chart).

Figure 16:
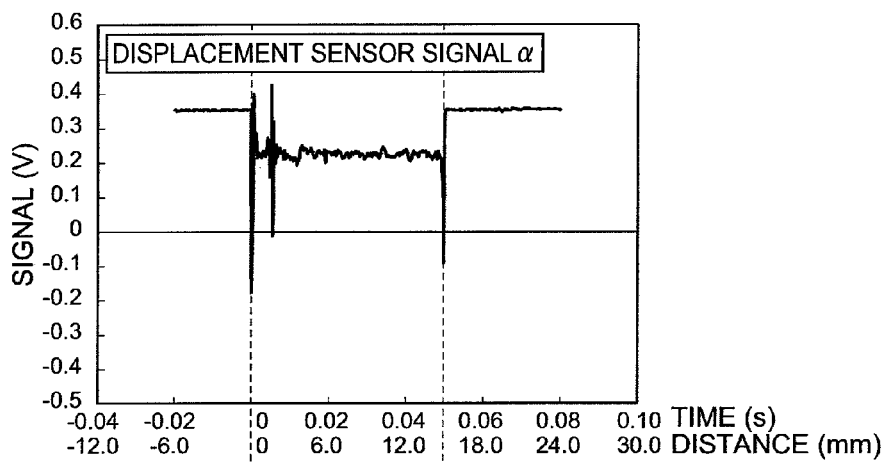
FIG. 16 is a chart for explaining an average difference in the laser processing method in accordance with an embodiment of the present invention.
Figure 16:
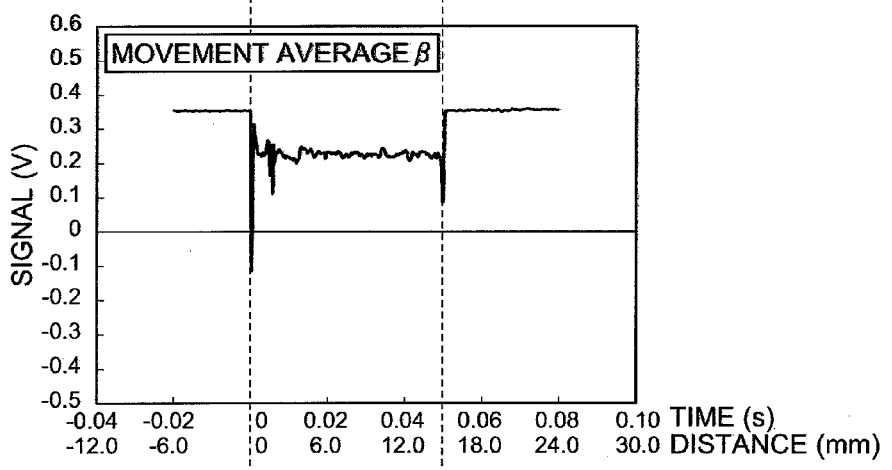
Figure 16:
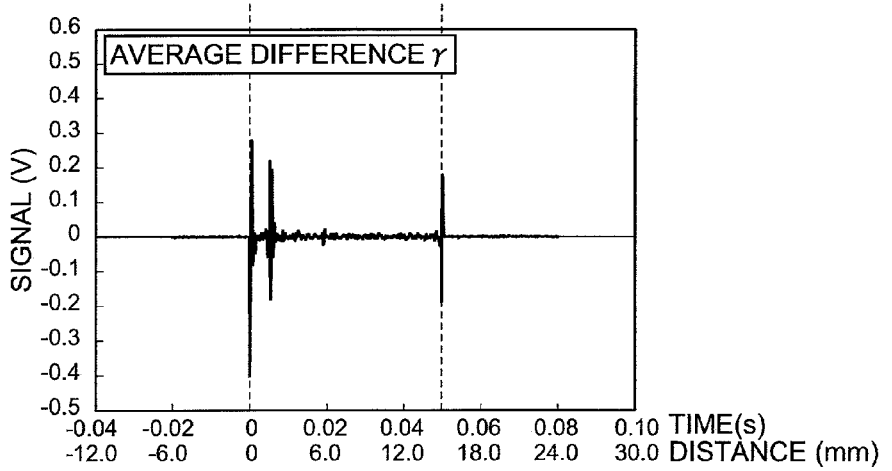

Hence, this embodiment executes the following operation. First, as illustrated in FIG. 16, a displacement sensor signal $\alpha$ is monitored along with the above-mentioned trace recording, and computes a movement average $\beta$ which is an average value of 8 samples of the displacement sensor signal $\alpha$, for example. Then, for further clarifying a part where the waveform of the signal fluctuates because of the presence of the particle in the displacement sensor signal $\alpha$ and for suppressing minute signal changes (noises) in parts other than this part, an average difference $\gamma$ which is the difference between the displacement sensor signal $\alpha$ and the movement average $\beta$ is calculated.

Figure 17:
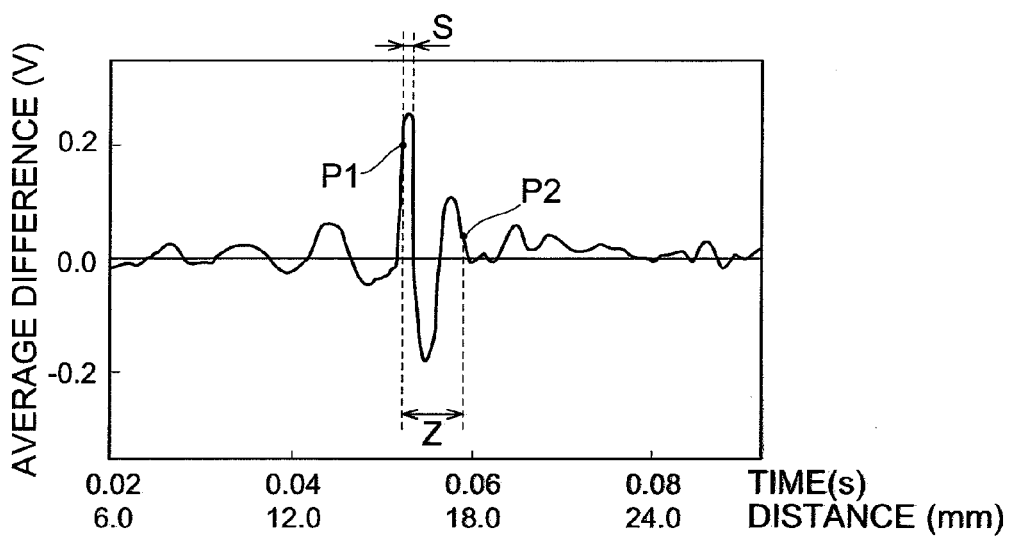
FIG. 17 is a chart for explaining a particle segment in the laser processing method in accordance with an embodiment of the present invention.

Subsequently, when the average difference $\gamma$ exceeds a predetermined threshold, a predetermined line segment including a line segment S where the average difference $\gamma$ exceeds a predetermined threshold in the line segment to cut is defined as a particle segment Z as illustrated in FIG. 17. Specifically, in the line segment to cut, a line segment to cut extending from a position P1 where the absolute value of the average difference $\gamma$ becomes 0.2 V or more to a position P2 where the absolute value of the average difference $\gamma$ becomes 0.05 V or less is defined as the particle segment Z. Thus, the particle existing in the line segment to cut is detected. One end (where the distance is 0 mm in FIG. 16) and the other end (where the distance is 15 mm in FIG. 16) of the object 1 become the entrance end and exit ends of the measuring laser light and thus randomly reflect the measuring laser light, whereby signal values at these ends are not taken into consideration in this embodiment.

Figure 18:
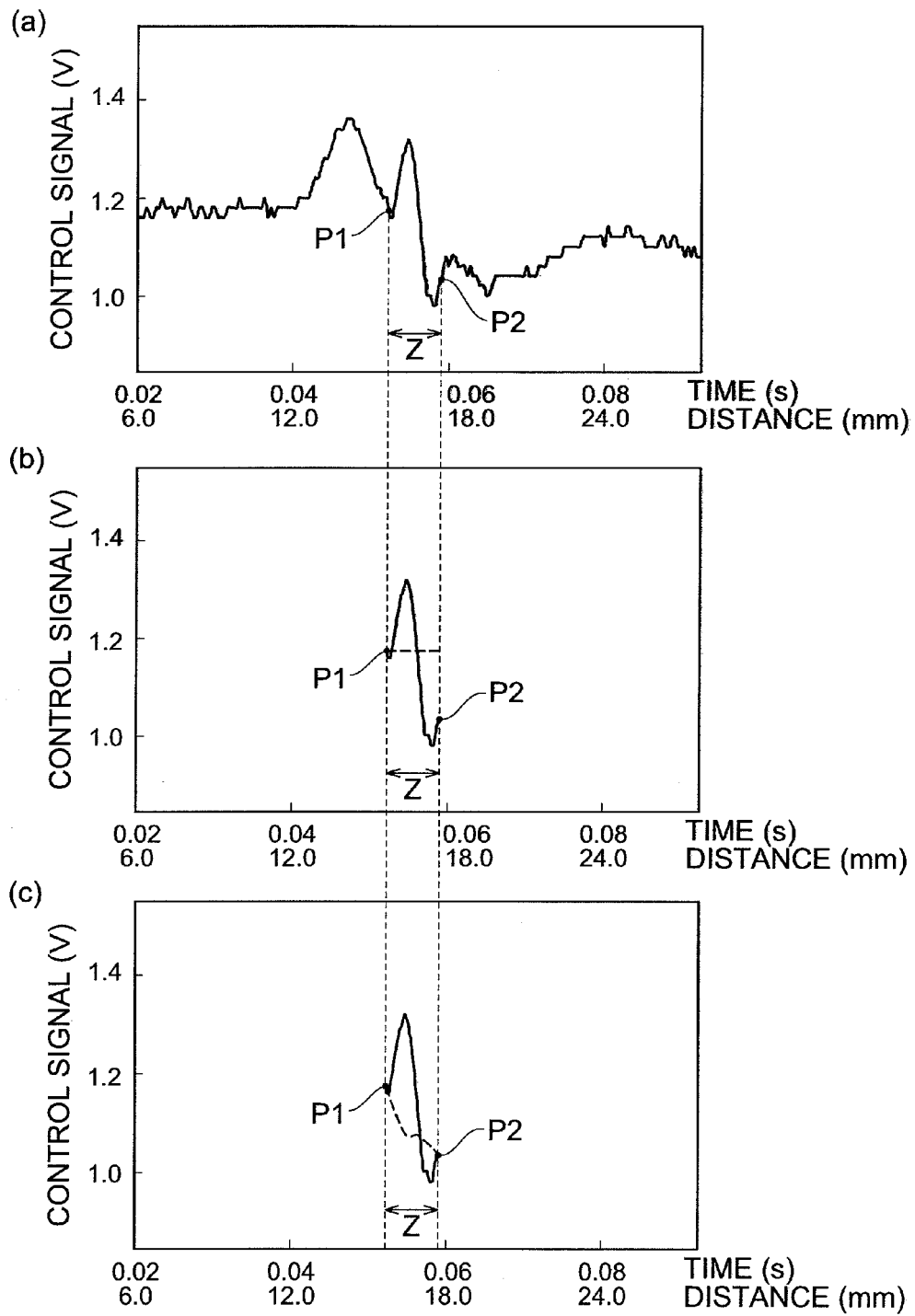
FIG. 18 is a chart for explaining a control signal in the particle segment in the laser processing method in accordance with an embodiment of the present invention.

Then, in the acquired control signal of the line segment to cut (see FIG. 18(a)), the control signal in the particle segment Z is made constant (as indicated by a broken line in FIG. 18(b)), so as to correct the control signal in the particle segment Z, and the trace recording is carried out again in the parts other than the particle segment Z (i.e., retrace recording is performed).

Specifically, while relatively moving the mount table again along the line to cut 5, the measuring laser light is emitted, the displacement sensor signal is calculated, the Z-directional position of the converging lens is controlled by the piezoelectric device such that the displacement sensor signal keeps the feedback reference value V0, and the control signal for this control is recorded again. At this time, the piezoelectric device is fixed in the particle segment Z. In other words, the Z-directional position of the converging lens in the particle segment Z is fixed during the retrace recording.

Alternatively, the control signal in the particle segment Z is smoothed with a control signal in the vicinity of the particle segment Z (as indicated by a broken line in FIG. 18(c)), so as to complement the control signal in the particle segment Z, and trace recording in the parts other than the particle segment Z is performed again.

Specifically, according to control signals in line segments to cut on the upstream and downstream sides of the particle segment Z, the control signal in the particle segment Z is complemented by a curve such that the line segments to cut on the upstream and downstream sides smoothly continue with each other. Thereafter, while the mount table is relatively moved again along the line to cut 5, the measuring laser light is emitted, the displacement sensor signal is calculated, the Z-directional position of the converging lens is controlled by the piezoelectric device such that the displacement sensor signal keeps the feedback reference value V0, and the control signal for this control is recorded again. Here, in the particle segment Z, the piezoelectric device is driven by the control signal complemented by the curve. In other words, during the retrace recording, the Z-directional position of the converging lens in the particle segment Z is that based on the control signal complemented by the curve.

Finally, the recorded control signal is reproduced by the piezoelectric device, so as to operate the converging lens in the Z direction, and the object 1 is irradiated with the processing laser light while locating a converging point within the silicon wafer 11. Here, the processing laser light is turned off in the particle segment Z. In other words, during the processing laser light irradiation, the processing laser light is not emitted in the particle segment Z. Thus, a modified region to become a cutting start region is formed within the silicon wafer 11.

Though this embodiment defines the difference between the displacement sensor signal α and movement average β as the average difference γ and provides the average difference γ with a threshold, so as to detect a particle existing in a line segment to cut, the difference between the displacement sensor signal α and feedback reference value V0 may be taken as an average difference, and the average difference may be provided with a threshold. Without yielding the average difference, the displacement sensor signal may directly be provided with a threshold, so as to detect a particle existing in a line segment to cut. Each of these cases corresponds to providing the detected value with a predetermined threshold.

As in the foregoing, at the time of trace recording, this embodiment determines the particle segment Z including the line segment S where the absolute value of the average difference γ exceeds 0.2 V, and corrects the control signal in the particle segment Z. This makes it possible to detect a segment where a particle exists in a line segment to cut as the line segment S and determine that the particle exists on the line to cut 5 and randomly reflects the measuring laser light. Also, a segment where the control signal is affected by the presence of the particle in the line segment to cut can be detected as the particle segment Z. Correcting the control signal in the particle segment Z can inhibit the converging lens from moving more than necessary in the Z direction because of an error included in the signal value under the influence of the presence of the particle, thus allowing the converging point of the processing laser light to accurately follow the front face 3 of the object 1. Therefore, the converging point can be located at a desirable position with respect to the front face 3, whereby a modified region can accurately be formed at a desirable position with respect to the front face 3. As a result, the particle is prevented from being irradiated with the processing laser light so as to be pulverized and scattered over its surroundings, and the pulverization is kept from damaging the object 1 as a whole.

Typical laser processing methods may fail to accurately acquire the control signal in the vicinity of the particle segment Z because of a delay in the response of the control signal to the average difference γ. For example, while the waveform of the average difference γ becomes stable by converging its disturbances on the downstream side of the particle segment Z in the line segment to cut, disturbances may still continue in the waveform of the control signal. Hence, by carrying out retrace recording for re-acquiring the control signal other than that in the particle segment Z as mentioned above, this embodiment can accurately acquire the control signal in the vicinity of the particle segment Z as well, thereby allowing the converging point of the processing laser light to follow the front face 3 more accurately.

As mentioned above, this embodiment corrects the control signal in the particle segment Z by making it constant or smoothing it by a control signal in the vicinity of the particle segment Z. This allows the converging point of the processing laser light to follow the front face 3 smoothly.

Meanwhile, a particle may enter between the expandable tape attached to the rear face 21 side of the object 1 and the mount table. In this case, in the part having the particle incorporated therein, the object 1 may extremely be deformed by the particle, so as to displace the front face 3 greatly. Hence, conventionally, the displacement of the front face 3 may not completely be detected by the measuring laser light, so that the converging point of the processing laser light may fail to accurately follow the front face 3. By determining the particle segment Z and correcting the control signal in the particle segment Z as mentioned above, the laser processing method in accordance with this embodiment can be employed in the case where the particle enters between the expandable tape and the mount table, so that the converging point of the processing laser light can accurately follow the front face 3 in this case as well.

Though a preferred embodiment of the present invention has been explained in the foregoing, the present invention is not limited to the above-mentioned embodiment.

For example, though the above-mentioned embodiment carries out retrace recording, retraces may be omitted when it is unnecessary to take account of the delay in the response of the control signal.

Though the above-mentioned embodiment employs an average value of 8 samples of the displacement sensor signal α as the movement average β as being preferred from the viewpoints of accuracy and speed of calculation, it may be an average value of 10 samples or set as appropriate.

The smoothing may complement the control signal in the particle segment with the control signal in the line segment to cut on the upstream or downstream side of the particle segment Z alone. It may be complemented by a line instead of a curve.

Not only the silicon wafer 11, but semiconductor compound materials such as gallium arsenide, piezoelectric materials, and crystalline materials such as sapphire, for example, may also be used. In this embodiment, the processing laser light may be emitted under various conditions without being limited by pulse pitch width, output, and the like.

INDUSTRIAL APPLICABILITY

The present invention can accurately form a modified region at a desirable position from a laser light irradiation surface of an object to be processed.

The invention claimed is:

1. A laser processing method of irradiating a planar object to be processed with processing laser light while locating a converging point within the object, so as to form a modified region to become a cutting start point within the object along a cutting line, the method comprising the steps of:
   irradiating the object with measuring laser light along the cutting line, so as to detect a signal value corresponding to a reflected light component of the measuring laser light reflected by a laser light irradiation surface irradiated with the measuring laser light in the object, and moving a converging lens for converging the processing laser light to a predetermined position with respect to the laser light irradiation surface such that the signal value corresponds to a predetermined value to acquire a reference signal for moving the converging lens along the cutting line in a segment of the cutting line; and subsequent to the step of acquiring the reference signal along the cutting line, while irradiating the object with the processing laser light and locating the converging point of the processing converging light at the predetermined position with respect to the laser light irradiation surface by moving the converging lens to the predetermined position, controlling a distance between the laser light irradiation surface of the object and the converging lens according to the signal value, and simultaneously relatively moving the converging lens along the cutting line, so as to form the modified region within the object;

wherein when the signal value has a value exceeding a predetermined threshold during said step of simultaneous relatively moving the converging lens along the cutting line, the signal value is corrected in the segment by the step of acquiring the reference signal.

2. The laser processing method according to claim 1, wherein the step of acquiring the signal value acquires the signal value other than that in the segment again along the cutting line when the signal value has a value exceeding the predetermined threshold.

3. The laser processing method according to claim 2, wherein the signal value is corrected in the segment by making the signal value constant in the segment.

4. The laser processing method according to claim 2, wherein the signal value is corrected in the segment by smoothing the signal value in the segment with the signal value in the vicinity of the segment.

5. The laser processing method according to claim 1, wherein the signal value is corrected in the segment by making the signal value constant in the segment.

6. The laser processing method according to claim 1, wherein the signal value is corrected in the segment by smoothing the signal value in the segment with the signal value in the vicinity of the segment.

7. The laser processing method according to claim 1, wherein the object has a semiconductor substrate, and wherein the modified region includes a molten processed region.

8. The laser processing method according to claim 1, further comprising the step of cutting the object along the cutting line from the modified region acting as the cutting start point.

9. The laser processing method according to claim 1, wherein the signal values at a one end and another end of the object are not taken into consideration.

10. The laser processing method according to claim 1, wherein in the step of controlling the distance, the distance between the laser light irradiation surface of the object and the converging lens is controlled such that the reflected light component of the measuring laser light remains in-focus on the laser light irradiation surface.

* * * * *